(12) United States Patent
Lien

(10) Patent No.: US 6,338,993 B1
(45) Date of Patent: Jan. 15, 2002

(54) METHOD TO FABRICATE EMBEDDED DRAM WITH SALICIDE LOGIC CELL STRUCTURE

(75) Inventor: Wan Yih Lien, Hsinchu (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/376,481

(22) Filed: Aug. 18, 1999

(51) Int. Cl.[7] ............................................ H01L 21/8242
(52) U.S. Cl. ........................ 438/238; 438/210; 438/649
(58) Field of Search ........................ 438/238, 253–256, 438/381, 393–396, 649, 651, 656, 682, 210

(56) References Cited

U.S. PATENT DOCUMENTS

| | | | |
|---|---|---|---|
| 5,858,831 A | * | 1/1999 | Sung ............................ 438/241 |
| 6,069,037 A | * | 5/2000 | Liao ............................. 438/241 |
| 6,074,915 A | * | 6/2000 | Chen et al. .................. 438/258 |

* cited by examiner

*Primary Examiner*—Jey Tsai

(57) ABSTRACT

A method for forming salicide on the peripheral logic region of the embedded DRAM without using a salicide block mask layer to protect the memory cell region of the embedded DRAM and without oxide wet dip to prevent oxide loss in the field oxide is disclosed. Additionally, the landing plug process in the memory cell region is performed by a self-aligned contact (SAC) etching process with a silicon nitride layer as an etching protective layer.

7 Claims, 4 Drawing Sheets

METHOD TO FABRICATE EMBEDDED DRAM WITH SALICIDE LOGIC CELL STRUCTURE

FIELD OF THE INVENTION

The present invention relates to a method for fabricating embedded dynamic-random-access memory (DRAM), more specifically, to a method for fabricating embedded DRAM with a logic cell structure having salicide contacts.

BACKGROUND OF THE INVENTION

As in the prior art, it is usually to use a salicide block mask layer to remain silicon oxide atop the memory cell region and then form salicide only on the periphery logic region in the embedded DRAM process, as shown in FIG. 1. Before forming salicide on the periphery logic region, it is necessary to remove silicon oxide layer atop the periphery logic region by wet dip, which increases the difficulty of controlling oxide loss in the STI or LOCOS field oxide.

Referring to FIG. 1, it demonstrates a cross-sectional view of an embedded DRAM structure with a logic cell and a memory cell. Besides, the logic cell of the embedded DRAM structure has salicide contact on the source/drain regions and the gate structures. A substrate 100 is provided for the base of the embedded DRAM structure and shallow-trench-isolation region 110 are formed in the substrate 100 to define a PMOS region 10, an NMOS region 20 and a memory cell region 30. A gate oxide layer 120 is formed on the PMOS region 10, the NMOS region 20 and the memory cell region 30. A gate structure 121 and a gate structure 122 are respectively formed on the gate oxide layer 120 on the PMOS region 10 and the NMOS region 20. The PMOS region 10 has source/drain regions 161 of a PMOS device in the substrate 100 and the NMOS region has source/drain region 162 of an NMOS device in the substrate 100. A salicide layer 150 is formed on the source/drain regions 161, 162, the gate structures 121 and 122. Furthermore, the gate structure 121 and the gate structure 122 are protected by spacers 130.

On the memory cell region 30, a stack structure consisting of a layer 123, a layer 124 and a layer 125 is formed on the gate oxide layer 120. The stack structure is indicated as the gate structure of the memory cells on the memory cell region 30. The stack structure is surrounded by the spacers 130, which is formed of silicon oxide or silicon nitride material. A silicon oxide layer 140 covers on the gate structure on the memory cell region 30 to serve as a protecting layer of the gate structure. The memory cell on the memory cell region 30 has source/drain regions 163 formed in the substrate 100.

For simultaneously fabricating the logic cells with salicide contacts and the memory cell on a substrate, a silicon oxide layer 140 covers on the memory cell region to protect the memory cells during the self-aligned silicide (salicide) process of the logic cells in the embedded DRAM. Before the salicide process is performed on the logic cells, the silicon oxide layer 140, as shown in FIG. 1, must be removed in the periphery logic region by wet dip.

As the silicon oxide layer 140 on the region 10 and 20 is stripped by wet etching techniques, the silicon oxide material in the shallow-trench-isolation region 110 could be etched and the isolation effect of the STI region 110 would be reduced because of the silicon oxide loss in the STI region 110. Alternatively, if the memory cell region is not protected by covering a silicon oxide layer, metal silicide layers will be formed on the memory cell region. The memory cells with silicide layers covering thereon would have not a good operating characteristics.

Therefore, a method for fabricating an embedded DRAM on a substrate is needed and the memory cells of the embedded DRAM must be protected by a protective layer during the salicide process of the logic cells in the device.

SUMMARY OF THE INVENTION

The present invention discloses a method to fabricate embedded DRAM with salicide logic cells and memory cells. A substrate is provided and isolation regions are formed thereon to define a logic cell region and a memory cell region. Besides, a gate structure is formed on the memory cell region. Light-doped-drain (LDD) regions of the logic cells are formed in the substrate adjacent to the gate structure. A silicon nitride layer is formed on the substrate and the gate structure. The silicon nitride layer is etched to expose the substrate in the logic cell region. An ion implantation process is performed to form source/drain regions of the logic cell region. Finally, a salicide process is performed to form a salicide layer on the source/drain regions of the logic cell region, wherein the gate structure of the memory cell region is protected by the silicon nitride layer during the salicide process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method for forming salicide on the embedded DRAM periphery logic region without using a salicide block mask layer to cover the embedded DRAM memory cell region and, in the meantime, without oxide wet dip to prevent oxide loss in the field oxide. In addition, the present invention also provides the landing plug process in the memory cell region by the self-aligned contact etch. For the embedded DRAM structure, it needs to form salicide in the periphery logic region to keep circuit speed and performance and remain polycide gate and n-silicon substrate in the memory cell region to prevent n-/P well junction leakage.

Figure 1:
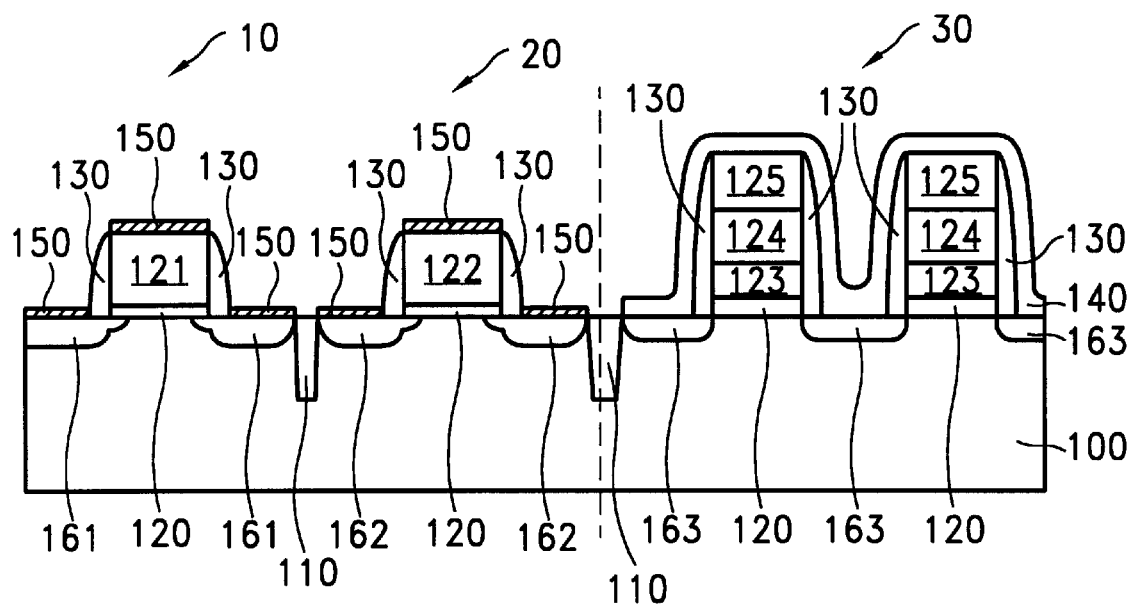
FIG. 1 shows a cross-section view of a substrate in accordance with the prior art, an embedded DRAM on the substrate has a logic cell consisting of a NMOS device and a PMOS device, and a memory cell.
Figure 2:
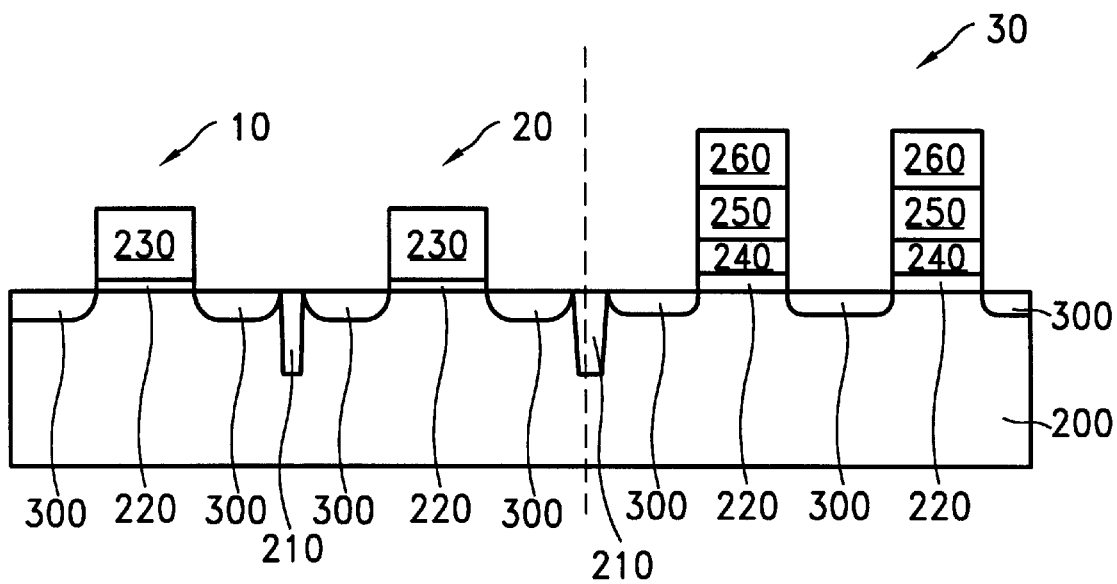
FIG. 2 shows a cross-section view of a substrate in accordance with the present invention, gate structures of a logic cell and a memory cell is formed on the substrate and light-doped-drain (LDD) regions are formed in the substrate adjacent the gate structures, wherein the logic cell and the memory cell are isolated from each other by shallow trench isolation.

Referring to FIG. 2, it shows a typical cross-sectional view of an embedded DRAM device, including a peripheral logic region and a memory cell region. As is well known in the prior art, the structure of the memory cell region and the periphery logic region is of conventional design and includes a plurality of transistors having various NLDD and PLDD implant regions.

Referring to FIG. 2, the embedded DRAM is formed by using a substrate 200 as a base. The substrate 200 is divided into a PMOS region 10, an NMOS region 20 and a memory cell region 30 by shallow-trench-isolation (STI) regions 210. The PMOS region 10 and the NMOS region 20 are indicated as a peripheral logic region of the embedded DRAM. Moreover, the STI regions 210 could be replaced by LOCOS field oxide regions to define the memory cell regions and the logic cell regions of the embedded DRAM device.

Still referring to FIG. 2, a gate oxide layer 220 is formed on the substrate 200 to serve as a gate dielectric layer of a PMOS device on the PMOS region 10, an NMOS device on the NMOS region 20 and a memory cell device on the memory cell region 30. A gate structure 230 is formed on the gate oxide layer 220 of the PMOS region 10 and the NMOS region 20. Furthermore, a doped polysilicon gate 240 is formed on the gate oxide layer 220 on the memory cell region 30 and a tungsten silicide (WSi$_x$) layer 250 is formed on the doped polysilicon gate 240. Subsequently, a cap layer 260 formed of TEOS material or silicon nitride material is formed on the tungsten silicide layer 250. The stack structure consisting of the layer 220, 240, 250 and 260 is the gate structure of the memory cells.

Referring to FIG. 2, light-doped-drain (LDD) regions 300 are formed in the substrate 200 in the PMOS region 10, the NMOS region 20 and the memory cell region 30. Besides, the LDD regions 300 are adjacent to the gate structure on the region 10, 20 and 30.

Figure 3:
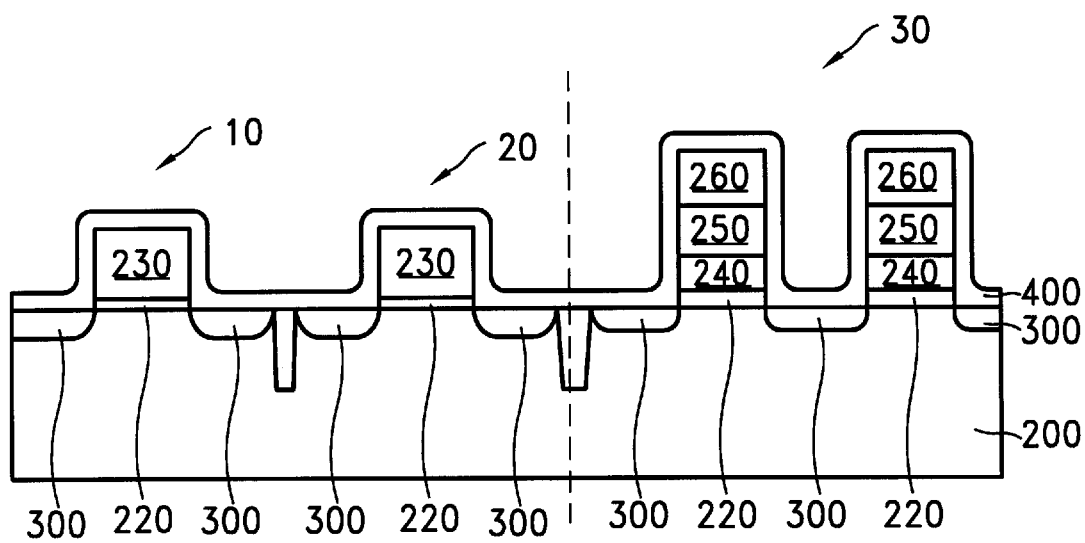
FIG. 3 shows a cross-section view of a substrate in accordance with the present invention, a silicon nitride layer is blanketly deposited on the gate structure and the substrate.

Next, referring to FIG. 3, a silicon nitride layer 400 is blanket deposited over the memory cell region 30, the NMOS region 20 and the PMOS region 10 and atop the gate structures on these regions. The silicon nitride layer 400 is used as a protective layer of the memory cell region 30 in a following salicide process. In a preferred embodiment of the present invention, the silicon nitride layer 400 has a thickness about from 500 to 1500 angstroms.

Figure 4:
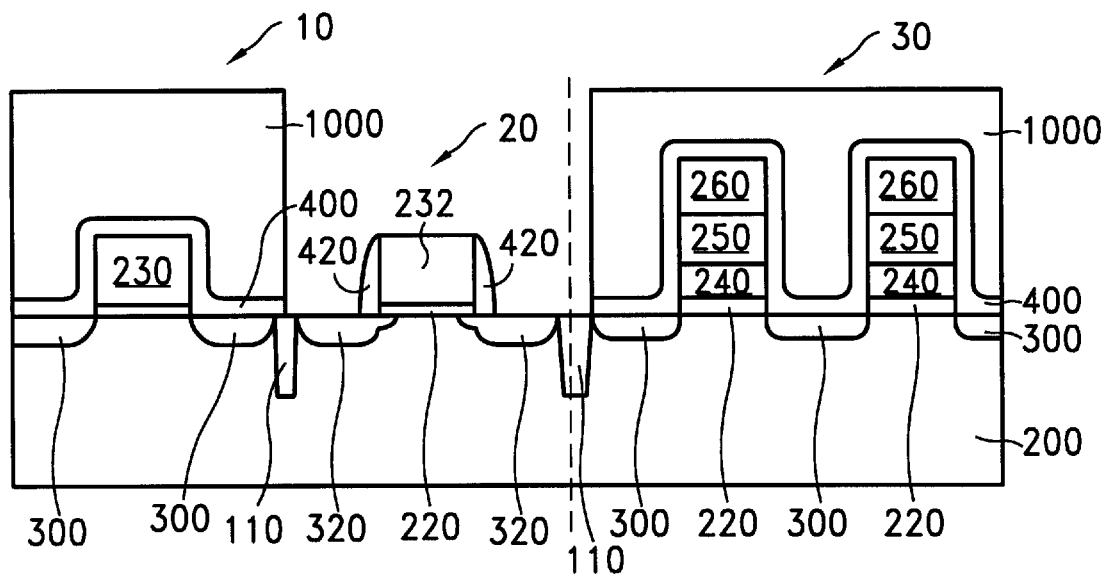
FIG. 4 shows a cross-sectin view of a substrate in accordance with the present invention, a photoresist layer covers the memory cell and the PMOS device of the logic cell to expose the NMOS device of the logic cell, the nitride spacers are formed on the gate structure of the NMOS device and an ion implantation process is performed to form the source/drain regions of the NMOS device.

Turning next to FIG. 4, a photoresist layer 1000 is defined and patterned so that the NMOS region 20 is exposed to etch and implant whereas the PMOS region 10 and the memory cell region 30 are covered by the photoresist layer 1000.

After the photoresist layer 1000 is defined, the silicon nitride layer 400 is etched to form silicon nitride spacers 420 of the gate structure on the NMOS region 20 and the photoresist layer 1000 is served as an etching mask.

Turning to FIG. 4, an ion implantation process is performed to implant n-type conductive ions into the gate structure and the substrate 200 of the NMOS region 20. Afterward, an n-type doped gate 232 and n-type doped source/drain regions 320 are formed. After the ion implantation process, the photoresist layer 1000 is stripped by using a conventional technique.

Figure 5:
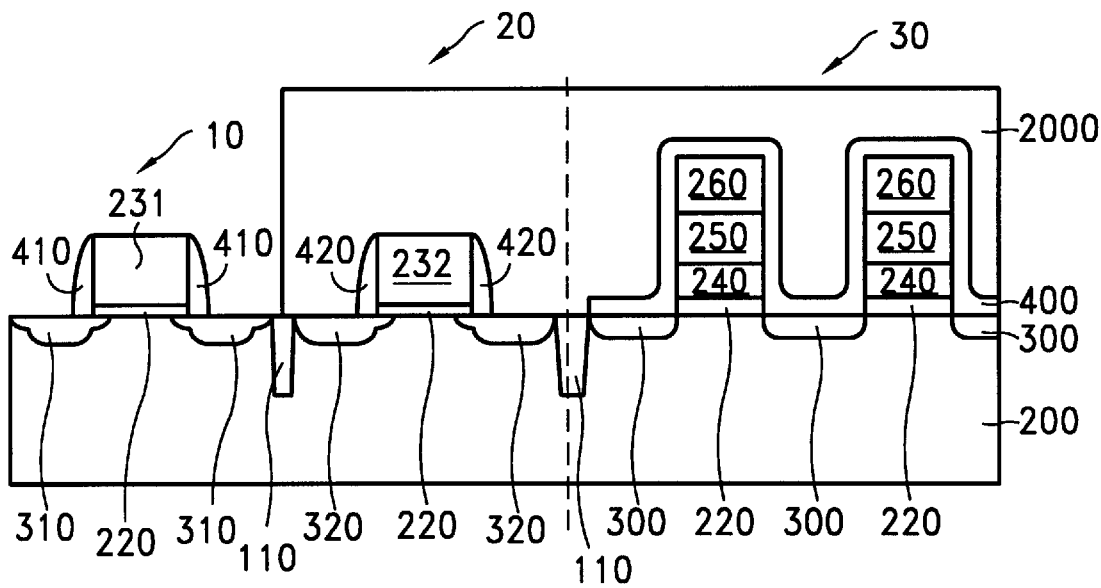
FIG. 5 shows a cross-section view of a substrate in accordance with the present invention, a photoresist layer covers the memory cell and the NMOS device of the logic cell to expose the PMOS device of the logic cell, the nitride spacers are formed on the gate structure of the PMOS device and an ion implanation process is performed to form the source/drain regions of the PMOS device.

Use of the similar process to form the periphery logic P+ region, as shown in FIG. 5. A photoresist layer 2000 is defined to cover the memory cell region 30 and the NMOS region 20 and it is served as a protective mask. An etching process is performed on the silicon nitride layer 400 to form silicon nitride spacers 410 of the gate structure on the PMOS region 10. After forming the silicon nitride spacers 410, p-type conductive ions are implanted into the gate structure on the PMOS region 10 to form a p-type doped gate 231 and the substrate 200 in the PMOS region 10 to form p-type source/drain regions 310 adjacent to the gate 231. After the ion implantation process of the PMOS region 10, the photoresist layer 2000 is stripped by using a conventional technique.

Figure 6:
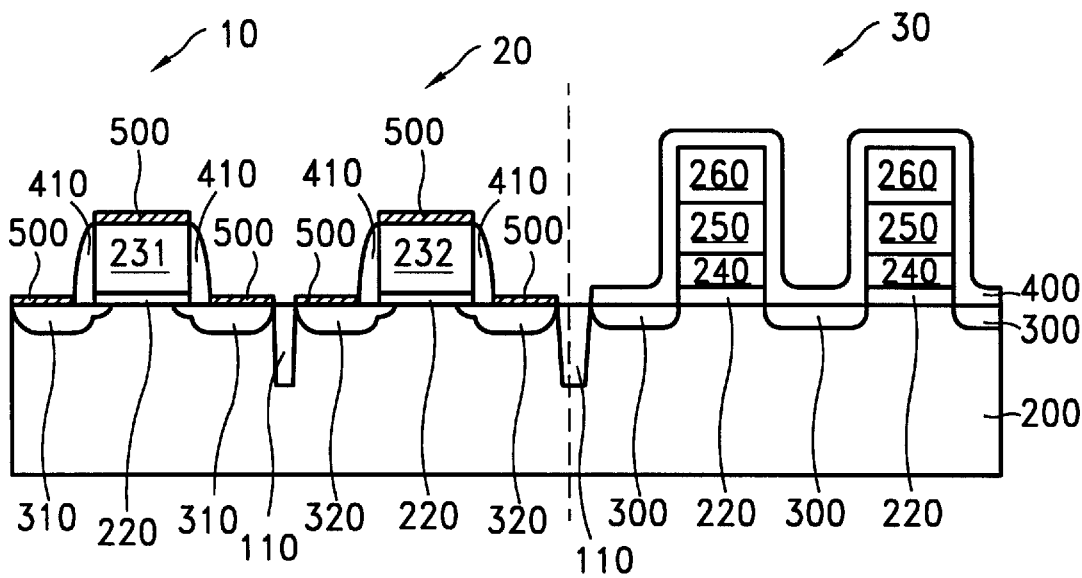
FIG. 6 shows a cross-section view of a substrate in accordance with the present invention, salicide layers are formed on the source/drain regions and the gate structures of the logic cell, the memory cell is protected by the nitride layer during the salicide process.

Next, referring to FIG. 6, a Ti or Co salicide layer 500 is formed over the p-type doped gate 231, the source/drain regions 310, the n-type doped gate 232 and the source/drain regions 320 by using a self-aligned silicide (salicide) process. It is noted that the memory cell region 30 can not be covered by the salicide layer 500 under the protection of the silicon nitride layer 400.

Figure 7:
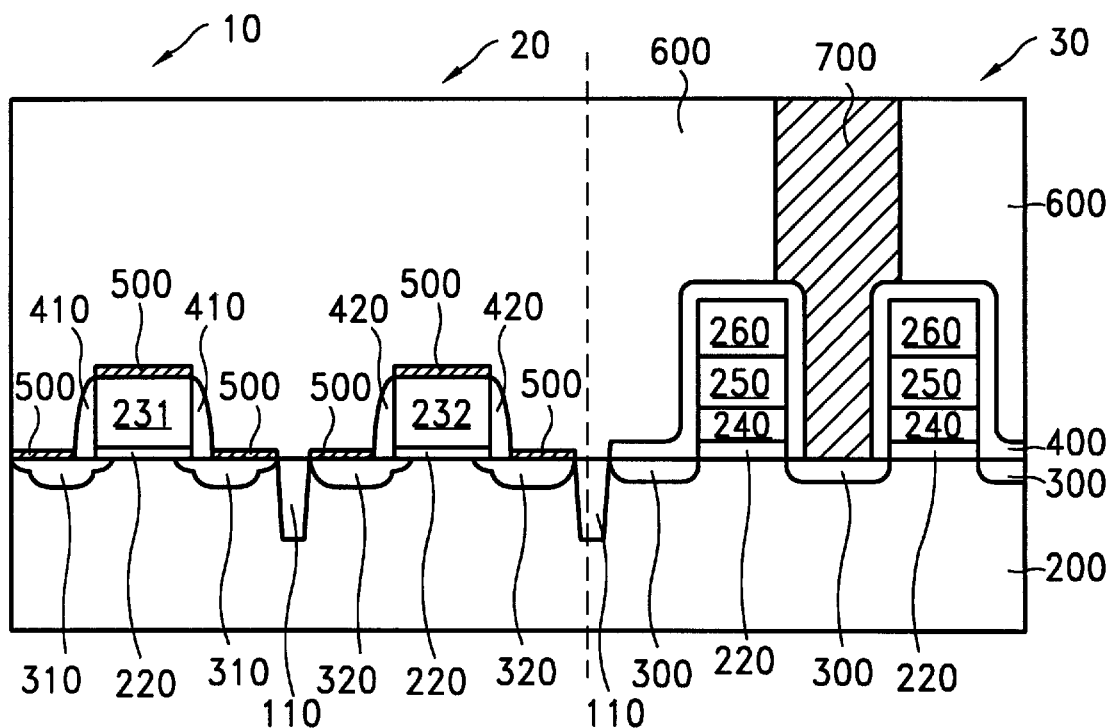
FIG. 7 shows a cross-section view of a substrate in accordance with the present invention, a silicon oxide layer is deposited on the logic cell and the memory cell to serve as an interlayer dielectric layer of the embedded DRAM and a plug is formed in the ILD layer to contact an active region of the memory cell by using the silicon nitride layer as a self-aligned mask.

Turning next to FIG. 7, an interlayer dielectric layer 600 is preferably formed from silicon dioxide, and more preferably formed from BPSG having a thickness of 3000 to 6000 angstroms. The use of BPSG is preferred to achieve local planarization over the gate pattern. Alternatively, USG silicon dioxide may be deposited using a high-density plasma process to obtain the gap-filling capability for narrow memory cell gate spacing in deep submicron DRAM products followed by CMP planarization. Self-aligned contacts on the memory cell region 30 using a high etching selectivity for silicon dioxide versus silicon nitride is also shown in FIG. 7. For example, the following etching recipe for this process may be used: for RIE machine, pressure is 30–50 milltorr, RF power is 1200–1800 watt, $C_4F_8$ is 5–9 sccm, Ar is 400–600 sccm, $CH_2F_2$ is 3–5 sccm. Note that in FIG. 7, the etching of the interlayer dielectric layer 600 can be controlled to stop on the silicon nitride layer 400 during the self-aligned contact etch process by using a high etching selectivity for $SiO_2$ versus SiN. Note also that in FIG. 7, a polysilicon layer (2500–5000 angstroms) is blanket deposited over the interlayer dielectric layer 600 and the polysilicon layer is then etched back or by using CMP to form a polysilicon plug 700.

The present invention provides a method for forming a salicide layer on the peripheral logic regions of the embedded DRAM without using a salicide block mask layer to cover the memory cell region of the embedded DRAM.

The method disclosed in the present invention is performed without wet dip to remove a silicon oxide protective layer before salicide has been formed in the periphery logic region, as in the prior art, which prevents STI or LOCOS field oxide damage, because the memory cell region of the embedded DRAM is protected by a silicon nitride layer.

The present invention also provides the landing plug process in the memory cell region by the self-aligned contact (SAC) etching process and the SAC process is performed by using a silicon nitride protective layer as an etching mask.

While the preferred embodiment of the invention has been illustrated and described, it will be appreciated that various changes can be made therein without departing from the spirit and scope of the invention.

What is claimed is:

1. A method to fabricate embedded DRAM with salicide logic cells and memory cells, comprising:

provideing a substrate, wherein isolation regions are formed thereon to define a PMOS region, a NMOS region and a memory cell region, a first gate structure is formed on said PMOS region, a second gate structure is formed on said NMOS region and a third gate structure is formed on said memory cell region;

forming light-doped-drain (LDD) regions in said substrate adjacent to said first gate structure, said second gate structure and said third gate structure;

forming a conformal silicon nitride layer on said substrate, said first gate structure, said second gate structure and said third gate structure;

forming a first photoresist pattern to cover said PMOS region and said memory cell region and to expose said NMOS region;

etching said silicon nitride layer to form second nitride spacers of said second gate structure after the first photoresist pattern is formed;

performing an N-type conductive ion implantation process to form N-type source/drain regions of an NMOS device on said NMOS region and dope N-type conductive ions into said second gate structure;

stripping the first photoresist pattern;

forming a second photoresist pattern to cover said NMOS region and said memory cell region and to expose said PMOS region;

etching said silicon nitride layer to form first nitride spacers of said first gate structure after the second photoresist pattern is formed;

performing a P-type conductive ion implantation process to form P-type source/drain regions of a PMOS device on said PMOS region and dope P-type conductive ions into said first gate structure;

stripping the second photoresist pattern; and performing a salicide process to form a salicide layer on said P-type source/drain regions, said first gate structure, said N-type source/drain regions and said second gate structure, wherein said third gate structure is protected by said silicon nitride layer during said salicide process.

2. The method according to claim 1, wherein said isolation regions comprises field oxide regions.

3. The method according to claim 1, wherein said isolation regions comprises shallow-trench-isolation regions.

4. The method according to claim 1, wherein said third gate structure comprises:

a gate oxide layer formed on said memory cell region;

an N-type doped polysilicon layer formed on said gate oxide layer;

a polycide layer formed on said N-type doped polysilicon layer; and a cap layer formed on said polycide layer.

5. The method according to claim 4, wherein said cap layer is selected from a group consisting of TEOS and silicon nitride material, said polycide layer is formed of $WSi_x$ material.

6. The method according to claim 1, wherein said salicide layer is formed of material selected from a group consisting of titanium salicide material and cobalt salicide material.

7. The method according to claim 1, wherein said silicon nitride layer on said third gate structure is indicated as a hard mask in a self-aligned process for forming a contact plug on said memory cell region.

* * * * *